(12) United States Patent
Liebmann et al.

(10) Patent No.: US 11,961,802 B2
(45) Date of Patent: Apr. 16, 2024

(54) POWER-TAP PASS-THROUGH TO CONNECT A BURIED POWER RAIL TO FRONT-SIDE POWER DISTRIBUTION NETWORK

(71) Applicant: Tokyo Electron Limited, Tokyo (JP)

(72) Inventors: Lars Liebmann, Mechanicsville, NY (US); Jeffrey Smith, Clifton Park, NY (US); Daniel Chanemougame, Niskayuna, NY (US); Paul Gutwin, Williston, VT (US)

(73) Assignee: Tokyo Electron Limited, Tokyo (JP)

( * ) Notice: Subject to any disclaimer, the term of this patent is extended or adjusted under 35 U.S.C. 154(b) by 375 days.

(21) Appl. No.: 17/328,236

(22) Filed: May 24, 2021

(65) Prior Publication Data

US 2022/0181258 A1      Jun. 9, 2022

Related U.S. Application Data

(60) Provisional application No. 63/121,847, filed on Dec. 4, 2020.

(51) Int. Cl.
*H01L 23/00* (2006.01)
*H01L 21/8238* (2006.01)
(Continued)

(52) U.S. Cl.
CPC .. *H01L 23/5286* (2013.01); *H01L 21/823871* (2013.01); *H01L 23/5283* (2013.01);
(Continued)

(58) Field of Classification Search
CPC ............. H01L 23/5283; H01L 23/5286; H01L 21/823475
See application file for complete search history.

(56) References Cited

U.S. PATENT DOCUMENTS 11,041,211 B2    6/2021   Jain
11,121,086 B2    9/2021   Hiblot et al.
(Continued)

FOREIGN PATENT DOCUMENTS

CN              111758157 A       10/2020
KR       10-2020-0134150 A       12/2020

OTHER PUBLICATIONS

International Search Report and Written Opinion of the International Searching Authority dated Feb. 7, 2022 in PCT/US2021/054649, (Submitting English translation only), citing documents AA-AH, AO and AP therein, 8 pages.

*Primary Examiner* — Reema Patel
(74) *Attorney, Agent, or Firm* — Oblon, McClelland, Maier & Neustadt, L.L.P.

(57) ABSTRACT

A semiconductor device includes a device plane including an array of cells each including a transistor device. The device plane is formed on a working surface of a substrate and has a front side and a backside opposite the front side. A signal wiring structure is formed on the front side of the device plane. A front-side power distribution network (FSPDN) is positioned on the front side of the device plane. A buried power rail (BPR) is disposed below the device plane on the backside of the device plane. A power tap structure is formed in the device plane. The power tap structure electrically connects the BPR to the FSPDN and electrically connects the BPR to at least one of the transistor devices to provide power to the at least one of the transistor devices.

20 Claims, 7 Drawing Sheets

(51) Int. Cl.
*H01L 23/528* (2006.01)
*H01L 27/092* (2006.01)
*H01L 29/06* (2006.01)
*H01L 29/423* (2006.01)
*H01L 29/66* (2006.01)
*H01L 29/786* (2006.01)

(52) U.S. Cl.
CPC ........ *H01L 27/092* (2013.01); *H01L 29/0665* (2013.01); *H01L 29/42392* (2013.01); *H01L 29/66742* (2013.01); *H01L 29/786* (2013.01)

(56) References Cited

U.S. PATENT DOCUMENTS

| | | |
|---|---|---|
| 11,195,797 B2 | 12/2021 | Vadi |
| 2019/0259702 A1 | 8/2019 | Jain |
| 2020/0203276 A1 | 6/2020 | Hiblot et al. |
| 2020/0266169 A1 | 8/2020 | Kang et al. |
| 2020/0373240 A1 | 11/2020 | Vadi |
| 2020/0381430 A1 | 12/2020 | Liebmann et al. |

POWER-TAP PASS-THROUGH TO CONNECT A BURIED POWER RAIL TO FRONT-SIDE POWER DISTRIBUTION NETWORK

INCORPORATION BY REFERENCE

This present disclosure claims the benefit of U.S. Provisional Application No. 63/121,847, filed on Dec. 4, 2020, the entire content of which is incorporated herein by reference in its entirety.

FIELD OF THE INVENTION

This disclosure relates to microelectronic devices including semiconductor devices, transistors, and integrated circuits, and methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

The present disclosure relates to a semiconductor device and the method of fabricating the semiconductor device.

An aspect (1) includes a semiconductor device. The semiconductor device includes a first device plane including an array of cells each including a transistor device. The first device plane is formed on a working surface of a substrate. The first device plane has a front side and a backside opposite the front side. A signal wiring structure is formed on the front side of the first device plane. A front-side power distribution network (FSPDN) is positioned on the front side of the first device plane. A first buried power rail (BPR) is disposed below the first device plane on the backside of the first device plane. A power tap structure is disposed in the first device plane. The power tap structure electrically connects the first BPR to the FSPDN and electrically connects the first BPR to at least one of the transistor devices to provide power to the at least one of the transistor devices An aspect (2) includes the semiconductor device of aspect (1), wherein the array of cells includes a logic cell, and the FSPDN includes a power tap track on a cell boundary of the logic cell. The power tap track is disposed in a first wiring layer (M0).

An aspect (3) includes the semiconductor device of aspect (2), wherein the power tap structure includes an LI structure, a top contact that is disposed on the front side of the LI structure and contacts the power tap track, and a power via that is disposed on the backside of the LI structure and contacts the first BPR.

An aspect (4) includes the semiconductor device of aspect (3), wherein the LI structure extends in a horizontal direction along the working surface of the substrate so as to contact the transistor device of the logic cell.

An aspect (5) includes the semiconductor device of aspect (4), wherein the FSPDN is electrically connected to the first BPR and the power tap structure, and the first BPR is configured to provide power to the transistor device via the LI structure.

An aspect (6) includes the semiconductor device of aspect (1), wherein the array of cells includes a pair of adjacent logic cells, and the first BPR is disposed on a common cell boundary of the pair of adjacent logic cells and is configured to function as a common BPR.

An aspect (7) includes the semiconductor device of aspect (6), wherein the FSPDN includes a common power tap track on the common cell boundary. The common power tap track is disposed in a first wiring layer (M0).

An aspect (8) includes the semiconductor device of aspect (7), wherein the power tap structure includes a common LI structure within the pair of adjacent logic cells, a common top contact that is disposed on the front side of the common LI structure and contacts the common power tap track, and a common power via that is disposed on the backside of the common LI structure and contacts the first BPR.

An aspect (9) includes the semiconductor device of aspect (8), wherein the common LI structure extends across the common cell boundary in a horizontal direction along the working surface of the substrate. One end of the common LI structure contacts a transistor device of one logic cell of the pair of adjacent logic cells, and another end of the common LI structure contacts a transistor device of the other logic cell of the pair of adjacent logic cells.

An aspect (10) includes the semiconductor device of aspect (9), wherein the FSPDN is electrically connected to the first BPR via the power tap structure, and the power tap structure is configured to function as a common power tap structure in order for the first BPR to provide power to the transistor devices on the two ends of the common LI structure.

An aspect (11) includes the semiconductor device of aspect (9), wherein the transistor devices include complementary field-effect transistors (CFETs). Each CFET has an N-type device over a P-type device. The P-type devices are configured to connect to the first BPR for $V_{DD}$ via the common LI structure, and the N-type devices in each adjacent logic cell are configured to connect to separate BPRs for $V_{SS}$ via separate power tap structures.

An aspect (12) includes the semiconductor device of aspect (1), wherein the array of cells includes a pair of adjacent logic cells. Only one logic cell of the pair of adjacent logic cells includes a power tap structure while the other logic cell of the pair of adjacent logic cells has a signal connection that is positioned away from an outer M0 track.

An aspect (13) includes the semiconductor device of aspect (1), further including a backside power distribution network (BSPDN) positioned below the first BPR on the backside of the first device plane. The first BPR is electrically connected to the BSPDN via a bottom through-silicon via (TSV).

An aspect (14) includes the semiconductor device of aspect (1), further including a power tap cell in the array of cells. The power tap cell provides power to the transistor device by electrically connecting the transistor device to the first BPR.

An aspect (15) includes the semiconductor device of aspect (14), wherein the power tap cell further includes a conductive structure that connects the first BPR to the FSPDN.

An aspect (16) includes the semiconductor device of aspect (1), further including a second device plane positioned below the first BPR, a second BPR below the second device plane, and a BSPDN below the second BPR. The second BPR is electrically connected to the BSPDN and is configured to provide power to a device in the second device plane.

According to an aspect (17) of the disclosure, a method of microfabrication is provided. The method includes forming a device plane including an array of cells each including a transistor device. The device plane is formed on a working surface of a substrate. The device plane has a front side and a backside opposite the front side. A buried power rail (BPR) is formed that is positioned below the device plane on the backside of the device plane. A signal wiring structure is formed on the front side of the device plane. A front-side power distribution network (FSPDN) is formed on the front side of the device plane. A power tap structure is formed in the device plane. The power tap structure electrically connects the BPR to the FSPDN and electrically connects the BPR to the transistor device to provide power to the transistor device.

An aspect (18) includes the method of aspect (17), wherein connection between the BPR and the FSPDN is formed after forming the array of cells.

An aspect (19) includes the method of aspect (17), further including forming a power tap cell in the array of cells. The power tap cell electrically connects the BPR to the FSPDN.

An aspect (20) includes the method of aspect (17), further including forming a backside power distribution network (BSPDN) on the backside of the device plane. The BSPDN is disposed below and connected to the BPR.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
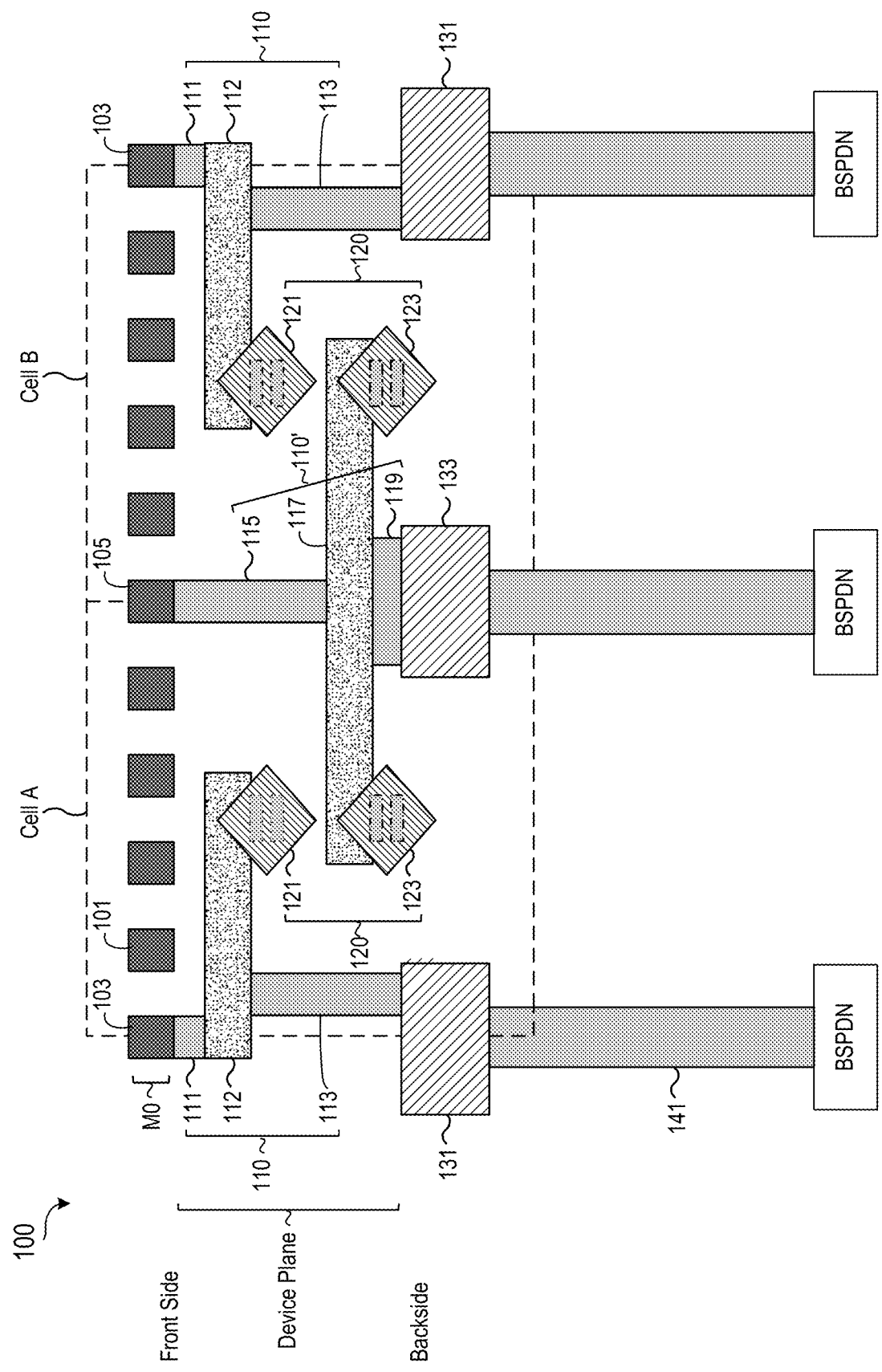
FIG. 1 is a cross-sectional diagram of a semiconductor device, in accordance with an embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

This disclosure includes a novel construct, associated process integration solution, and design methodology to efficiently and compactly connect a buried power rail (BPR) to a front-side power distribution network (FSPDN). This disclosure can build on U.S. application Ser. No. 16/659,251 (filed on Oct. 21, 2019), which is incorporated herein by reference, which described a middle-of-line power delivery network for complementary field-effect transistors (CFETs) using a BPR. A BPR is a rail positioned below active devices, relative to a surface of a wafer.

With pitch scaling slowing down for lithographic, economic, and device performance reasons, the semiconductor industry has been looking towards cell height reduction as a means to achieving the desired 50% node-to-node area scaling. Very importantly, the ultimate cell height scaling target of 5T (i.e., cell height=5× pitch of densest horizontal metal) may only be achieved with a BPR. Note that the term "height" can be used in two ways. When considering a cell layout from a top view, height refers to a lateral dimension of the cell layout. When fabricating transistors, however, there could be a height of structure in the z direction. For example, in FIGS. 3A-3C, height refers to a lateral dimension, such as a width of the corresponding cell.

Figure 3A:
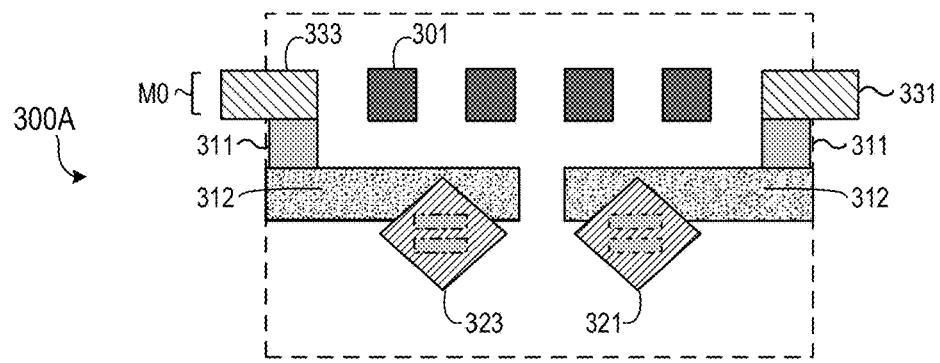
FIGS. 3A, 3B, and 3C show cross-sectional diagrams of a lateral nanosheet device with conventional power rails, a lateral nanosheet device with buried power rails, and a complementary field-effect transistor device with buried power rails, respectively, in accordance with some embodiments of the disclosure.
Figure 3B:
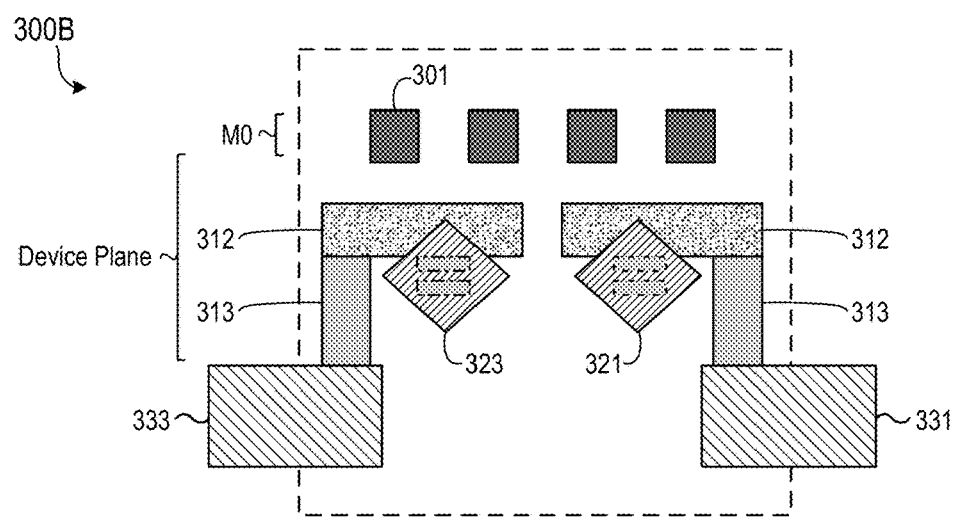
Figure 3C:
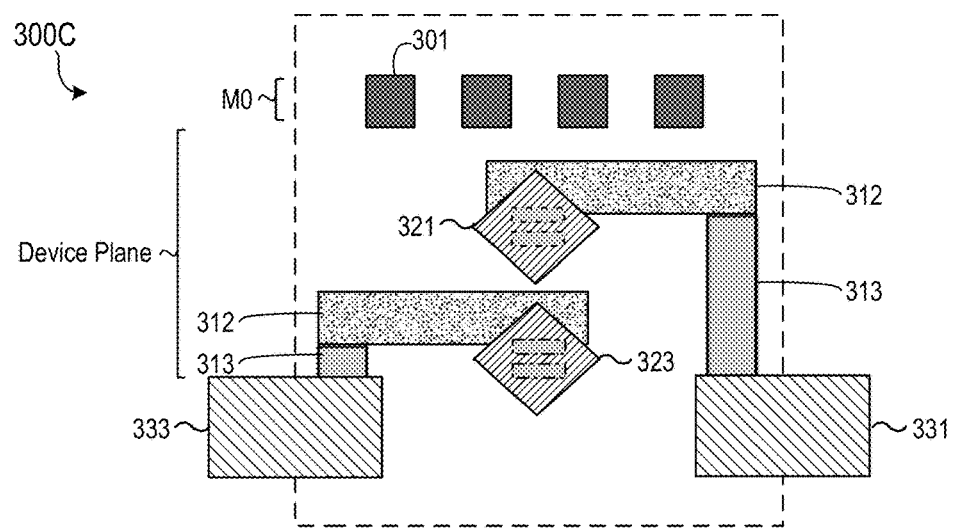

The importance of a BPR in cell height scaling is illustrated in FIGS. 3A-3C that show cross-sectional diagrams of a lateral nanosheet device with conventional power rails, a lateral nanosheet device with BPRs, and a complementary CFET with BPRs, respectively, in accordance with some embodiments of the disclosure.

In related examples, FIG. 3A can be a cross section of source/drain (S/D) regions of a logic device. The dotted line can be a boundary of a logic cell 300A. As shown, the logic cell 300A can include a lateral nanosheet device, such as an N-type device 321 and a P-type device 323, in addition to a first wiring layer (M0) above an active device region. In a non-limiting example, the N-type device 321 and the P-type device 323 can be configured to connect to power rails 331 and 333 for $V_{SS}$ and $V_{DD}$, respectively. For example, the P-type device 323 can be connected to the power rail 333 by a top contact structure 311 and a top local interconnect (LI) structure 312. Note that the power rails 331 and 333 are located within the M0 layer and thus also referred to as M0 power rails.

To render complex combinatorial and sequential logic cells in the most compact transistor placement, four signal tracks 301 are required in the M0 layer. To deliver power into the logic cell with a conventional power rail (e.g., 331 and 333), referred to herein as a M0 power rail, without incurring performance limiting voltage drop (commonly referred to as IR drop), a 2× wide (i.e., a wire of twice the metal half/pitch centered on the cell boundary) shared power rail (e.g., 331 and 333) is seen as the narrowest acceptable structure. Four signal tacks 301 plus a 2× wide shared power rail limit the cell height to 5.5T at the theoretic limit.

While FIG. 3A shows a lateral nanosheet device with M0 power rails, FIG. 3B can show the same device (i.e., a highly stylized drawing of a lateral nanosheet device) with BPRs 331 and 333 below the device plane to allow cell footage reduction. Burying the power rails under physical devices can allow for the cell height of the standard cell to be defined by the number of routing tracks or signal lines as opposed to a combination of power rails and routing tracks. As illustrated, the BPRs 331 and 333 are connected to transistor devices 321 and 323 by power vias 313. Therefore, in this architecture, the power is delivered to the transistor devices 321 and 323 by BPRs 331 and 333 that sit below the device plane, allowing the cell height to be reduced to 5T (i.e., four signal tracks 301 plus a one-track space to neighboring cells; in other words, four wiring tracks for signaling plus one wiring track to absorb line-end extensions and tip-to-tip spacing in tightly packed cells).

Further, the benefit of BPR in cell height reduction is preferentially exploited alongside a change in device architecture from a lateral nanosheet device (FIG. 3B) or a fin field-effect transistor (FinFET) (not shown) to a complimentary FET (CFET) as shown in FIG. 3C. In the CFET approach, a logic cell 300C having an N-type device (e.g., N-type metal-oxide-semiconductor transistor) and a P-type device (e.g., P-type metal-oxide-semiconductor transistor) is essentially folded so that one of the two devices, such as the N-type device 321, is disposed on top of the other device of the two devices, such as the P-type device 323. The P-type device and the N-type device can share a common gate (not shown). Accordingly, a source region of the N-type device 321 can be connected to the BPR 331 for $V_{SS}$, and a drain region of the P-type device 323 can be connected to the BPR 333 for $V_{DD}$. Folding the two complementary devices on top of each other can eliminate the substantial lateral space needed between the N-type device 321 and the P-type device 323 and put the standard cell logic design in a domain where cell height is limited by the cumulative width of required wiring tracks rather than device width.

Figure 4A:
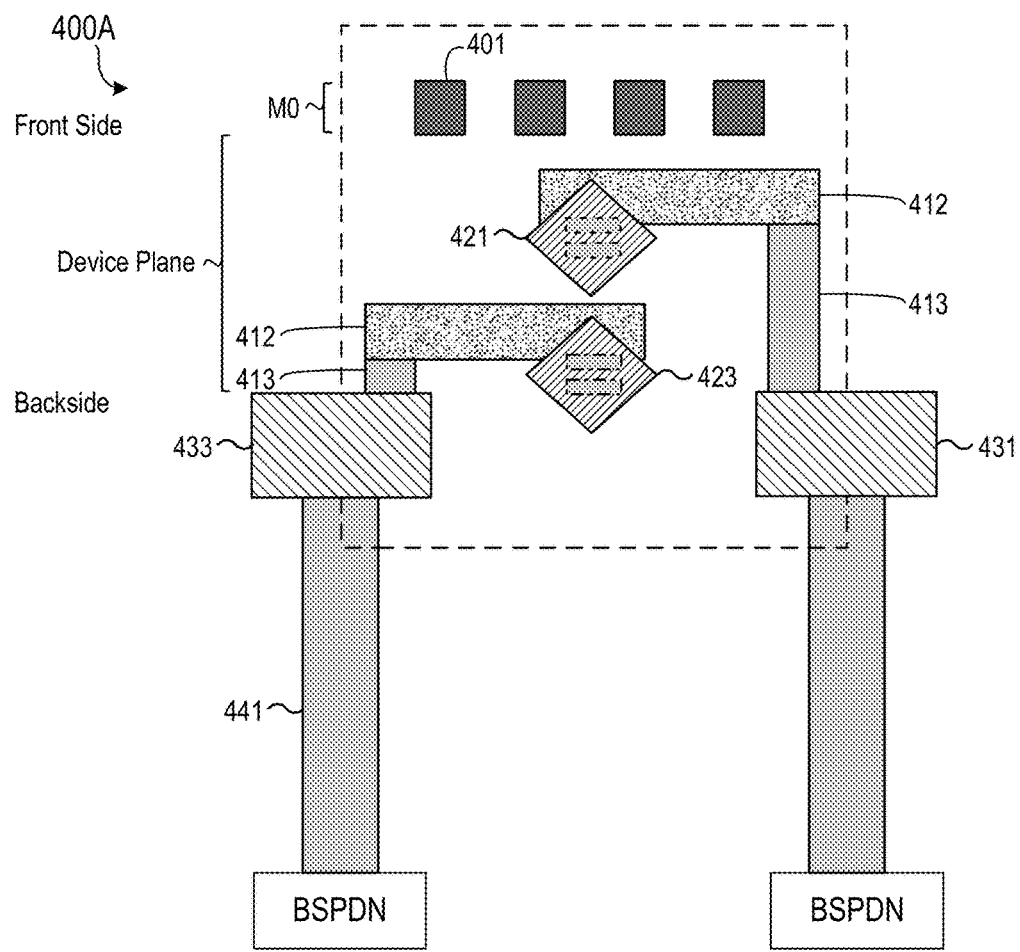
FIGS. 4A and 4B show cross-sectional diagrams of buried power rails with a backside power distribution network and a front-side power distribution network, respectively, in accordance with some embodiments of the disclosure.
Figure 4B:
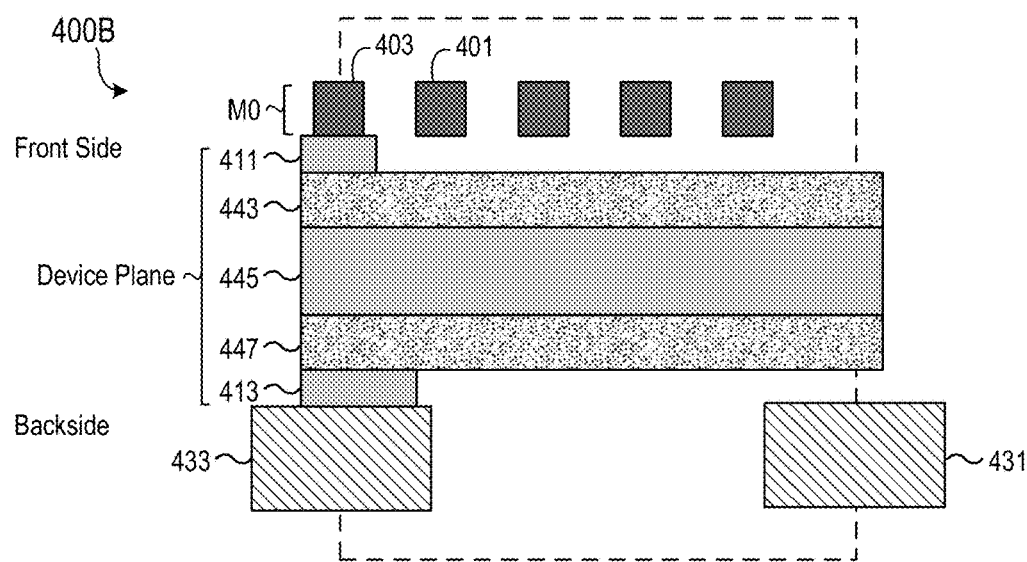

FIGS. 4A and 4B show cross-sectional diagrams of BPRs with a backside power distribution network (BSPDN) and a front-side power distribution network (FSPDN), respectively, in accordance with some embodiments of the disclosure.

One challenge with BPR implementation lies in getting power into the BPR. That is, how to connect the BPR to the rest of the power delivery network (PDN). One approach, as shown in FIG. 4A, is a BSPDN in which power is connected to the BPRs 431 and 433 with bottom through-silicon vias (TSVs) 441. BSPDN has tremendous design advantages because the PDN no longer competes with signal wiring for sparse wiring resources. BPR is a preferred implementation of BSPDN because the BPR provides a convenient landing shape for the TSV. Note that process challenges and additional cost associated with BSPDN favor the continued use of FSPDN for many products.

For FSPDN, this power connection cannot afford to be too small for risk of creating a current pinch-point or be too large for risk of interfering with dense cell placement. As disclosed in the referenced patent document and illustrated in FIG. 4B, one means of connecting a BPR to an FSPDN is to use "power tap cells." Power tap cells herein refer to dedicated cells that provide no logic function and are designed solely to deliver power from the FSPDN past the device plane, into the BPR. In a non-limiting example, a power tap cell 400B includes a power tap track 403 and four signal tracks 401 in an M0 layer. A BPR 433 is connected to the power tap track 403 via a top contact structure 411, a top LI structure 443, a strap structure 445, a bottom LI structure 447, and a bottom power via 413. As a result, the BPR 433 can be further connected to an FSPDN (not shown) via the power tap track 403 and some wiring structure (not shown) above the M0 layer. In some embodiments, the top LI structure 443 and the bottom LI structure 447 correspond to top LI structures 412 in FIG. 4A.

Similarly, a BPR 431 can also be connected to the FSPDN by another power tap cell (not shown). In some embodiments, the BPRs 433 and 431 are configured to provide power, such as $V_{DD}$ and $V_{SS}$, respectively. Accordingly, another power tap cell identical to the power tap cell 400B is built for the complementary power supply, and these power-tap cells generally come in pairs (one for $V_{DD}$ and the other one for $V_{SS}$). Further, the device plane can include other cells, such as a logic cell as adjacent cells on a wafer. Power can thus be delivered from the FSPDN to the other cells via the power tap cell 400B and the like, and the BPRs 431 and 433 and the like.

One challenge with power tap cells is their negative impact on placement density. This challenge can be seen in FIGS. 5A and 5B that show showing an array of cells having PDN for an M0 power rail and PDN for BPRs using power tap cells, respectively, in accordance with some embodiments of the disclosure.

Figure 5A:
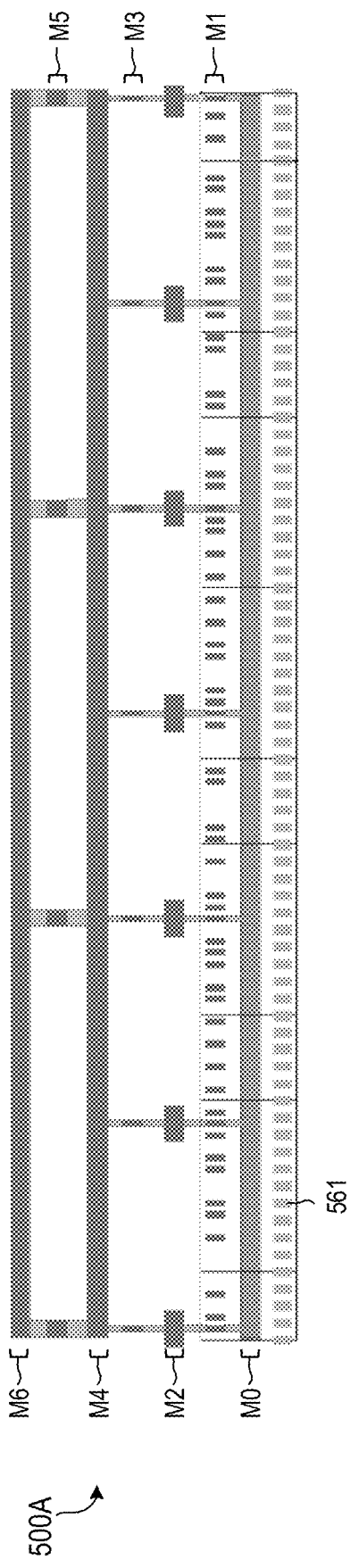
FIGS. 5A and 5B are cross-sectional diagrams showing an array of cells having a power distribution network for M0 power rails and a power distribution network for buried power rails using power tap cells, respectively, in accordance with some embodiments of the disclosure.

In some embodiments, FIG. 5A can illustrate a cross section of cell designs placed into an FSPDN. Generally, a semiconductor device can include a plurality of metal layers, such as seven metal layers that are referred to as M0, M1, M2, M3, M4, M5, and M6 from bottom to top. In some examples, the metal layer M0 is generally used for connections within a standard cell, and the metal layers M1-M6 are above the metal layer M0 and can function as the FSPDN. While signal wires between power wires are not shown, delivering power from the FSPDN through metal and via stacks into the M0 power rail does not impact cell placement because the cell layouts have sufficient porosity in the M1 level to allow cells to be placed such that the cell-level M1 does not interfere with the power-delivery M1. Additionally, a plurality of active devices 561 can be disposed below the M0 level with no interference from power delivery routing.

Figure 5B:
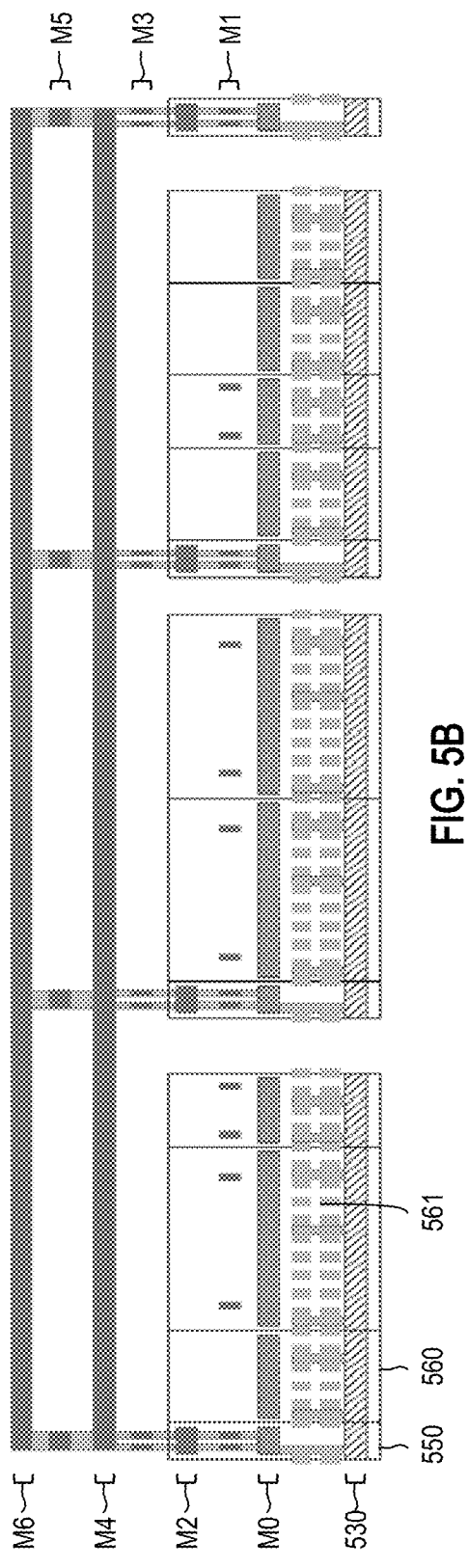

In contrast, power tap cells 550 are designed across the entire middle-of-line (MOL) stack and completely occupy the space given to them when BPRs 530 are used, as shown in FIG. 5B. As a result, functional logic cells 560 cannot be placed around the power tap cells 550 and must instead be placed between the power tap cells 550. This placement constraint of power tap cells affects circuit density in two ways. One way is that density is lost to the area of the actual power tap cells (e.g., two poly tracks every 24 tracks=8% density loss). Density is also lost to quantization, that is, the width of all cells placed in between power tap cells has to add up to less than or equal to the available space.

Figure 6:
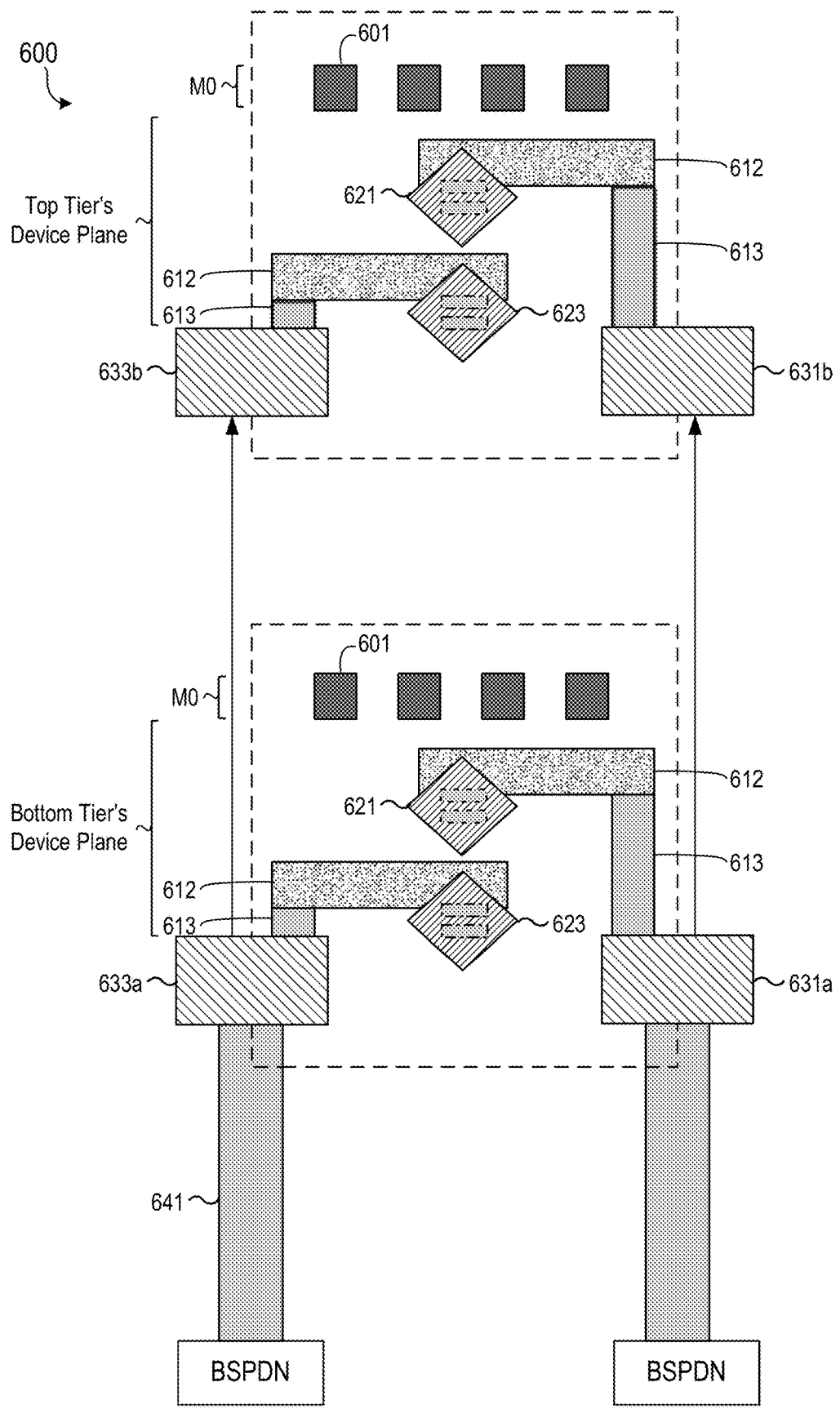
FIG. 6 shows a cross-sectional diagram of multi-tier design, according to some embodiments of the disclosure.

FIG. 6 shows a cross-sectional diagram of multi-tier design represented by a circuit 600 having two tiers, according to some embodiments of the disclosure. As the semiconductor industry is continuing its pursuit of density scaling into the third dimension, even a BSPDN does not alleviate the need to efficiently connect the BPR to the wiring stack above the device plane. Herein, a multi-tier 3D integrated circuit cross section is shown. This circuit 600 can be built sequentially or monolithically on top of a common wafer substrate. This circuit 600 needs to have a power supply routed from the BSPDN through a bottom tier's BPR (e.g., 631a and 633a) past the bottom tier's device plane into an inter-tier wiring stack region (not shown) in order to be connected to an upper-tier's BPR (e.g., 631b and 633b).

In an alternative embodiment, the circuit 600 may use an FSPDN instead of a BSPDN. Accordingly, the circuit 600 needs to have a power supply routed from the FSPDN through the top tier's BPR (e.g., 631b and 633b) past the inter-tier wiring stack and the bottom tier's device plane in order to be connected to the bottom-tier's BPR (e.g., 631a and 633a). That is, power would have to cross active device regions with only a BSPDN or with only an FSPDN, in the case of a multi-tier design.

Techniques herein provide designs and methods that efficiently and compactly connect a BPR to an FSPDN. Techniques include using space allocated to make robust connections between LI and the BPR (i.e., the power taps drawing power from the power rail and feeding it into the devices) to connect the BPR to the wiring above the device plane. By opportunistically connecting the empty M0 track to LI over existing power taps, this power pass-through construct provides a highly redundant connection with many parallel vertical current paths and minimal lateral current load on the 1×M0 wire.

FIG. 1 is a cross-sectional diagram of a semiconductor device 100, in accordance with an embodiment of the disclosure. The semiconductor device 100 can include a device plane that has an array of cells. Each cell can include a transistor device. The device plane is formed on a working surface of a substrate (not shown), and the device plane has a front side and a backside opposite the front side. In the example of FIG. 1, the array of cells includes a pair of adjacent logic cells (e.g., Cell A and Cell B). In a non-limiting example, Cell A and Cell B each include a CFET device 120 that has an N-type device 121 on top of a P-type device 123. The semiconductor device 100 also includes a signal wiring structure and a front-side power distribution network (FSPDN) on the front side of the first device plane. In the FIG. 1 example, the signal wiring structure includes four signal tracks 101 in a first wiring layer (M0). The FSPDN includes a power tap track 103 on a cell boundary of the logic cell (e.g., Cell A or Cell B).

The semiconductor device 100 further includes BPRs (e.g., 131 and 133) that are disposed below the device plane on the backside of the device plane. As shown, a power tap structure 110 electrically connects a BPR 131 to the power tap track 103 so that the BPR 131 is connected to the FSPDN via the power tap structure 110. The power tap structure 110 also electrically connects the BPR 131 to at least one of the transistor devices (e.g., 121) to provide power to the at least one of the transistor devices (e.g., 121). Specifically, the power tap structure 110 includes an LI structure 112, a top contact 111 that is disposed on the front side of the LI structure 112 and contacts the power tap track 103, and a power via 113 that is disposed on the backside of the LI structure 112 and contacts the BPR 131. Additionally, the LI structure 112 extends in a horizontal direction along the working surface of the substrate so as to contact the transistor device (e.g., 121) of the logic cell. The BPR 131 can thus be connected to the N-type device 121 by the power via 113 and the LI structure 112. As a result, the BPR 131 can be configured to provide power (e.g., $V_{SS}$) to a source region of the N-type device 121.

In some embodiments, the semiconductor device 100 may include a pair of adjacent logic cells, such as Cell A and Cell B in FIG. 1. In a non-limiting example, a common BPR 133 is disposed on a common cell boundary of the pair of adjacent logic cells. Accordingly, the M0 layer includes a common power tap track 105 on the common cell boundary. Note that the common power tap track 105 is part of the FSPDN. Similarly, a common power tap structure 110' electrically connects the common BPR 133 to the common power tap track 105 so that the common BPR 133 is connected to the FSPDN via the common power tap structure 110'. The common power tap structure 110' also electrically connects the common BPR 133 to at least one of the transistor devices (e.g., 123) in each cell to provide power to the at least one of the transistor devices (e.g., 123) in each cell. Specifically, the common power tap structure 110' includes a common LI structure 117, a common top contact 115 that is disposed on the front side of the common LI structure 115 and contacts the common power tap track 105, and a common power via 119 that is disposed on the backside of the common LI structure 117 and contacts the common BPR 133. Additionally, the common LI structure 117 extends across the common cell boundary in a horizontal direction along the working surface of the substrate. One end of the common LI structure 117 contacts a transistor device (e.g., 123) of one logic cell (e.g., Cell A), and another end of the common LI structure 117 contacts a transistor device (e.g., 123) of the other logic cell (Cell B). The common BPR 133 can thus be configured to provide power (e.g., $V_{DD}$) to drain regions of the P-type devices 123 in both Cell A and Cell B. Note that in this example, the common BPR 133 is configured to provide power to the transistor devices (e.g., 123) on the two ends of the common LI structure 117 whereas in related examples, the common BPR 133 may be connected to the P-type devices 123 separately by individual LI structures in Cell A and Cell B. Hence, in the FIG. 1 example, the power-tap LI of both cells can be merged, and a wider contact can be formed for the common BPR 133, making for a very robust performance.

Further, in some embodiments, the semiconductor device 100 may include a BSPDN that is positioned below the BPRs 131 and 133. The BPRs 131 and 133 can be connected to the BSPDN via bottom TSVs 141. In some embodiments, the array of cells can include one or more power tap cells (not shown) that are similar to the power tap cell 400B in FIG. 4B. The one or more power tap cells are configured to connect the BPRs (e.g., 131 and 133) to the FSPDN. Ergo, a highly redundant connection can be formed to reduce current load on M0 wires in the M0 layer.

As FIG. 1 illustrates, the disclosed construct takes advantage of both the empty M0 track on the cell boundary (i.e., the track that is not usable for intra-cell wiring because it is shared between adjacent cells, e.g., 105) and the available space around the LI power-taps (i.e., space between the power-tap of one cell and the signal LI of the adjacent cell), to connect the BPRs (e.g., 133) to the wiring stack above the device plane. A preferred technique is when cells on both sides of the power rail have a power-tap in the same track as shown in the FIG. 1 example. In this embodiment, the power-tap LI of both cells can be merged (e.g., the common LI structure 117), and a wider contact (e.g., the common power via 119) can be formed for the common BPR 133, thus making for a very robust performance. In an alternative embodiment, only one cell can have a power-tap while the other cell has a signal connection that is not on the outer M0 track. This alternative embodiment allows the power-tap to be extended and a contact to M0 to be formed. Some example layouts for these power pass-through construct embodiments will be further shown in FIG. 2.

Figure 2:
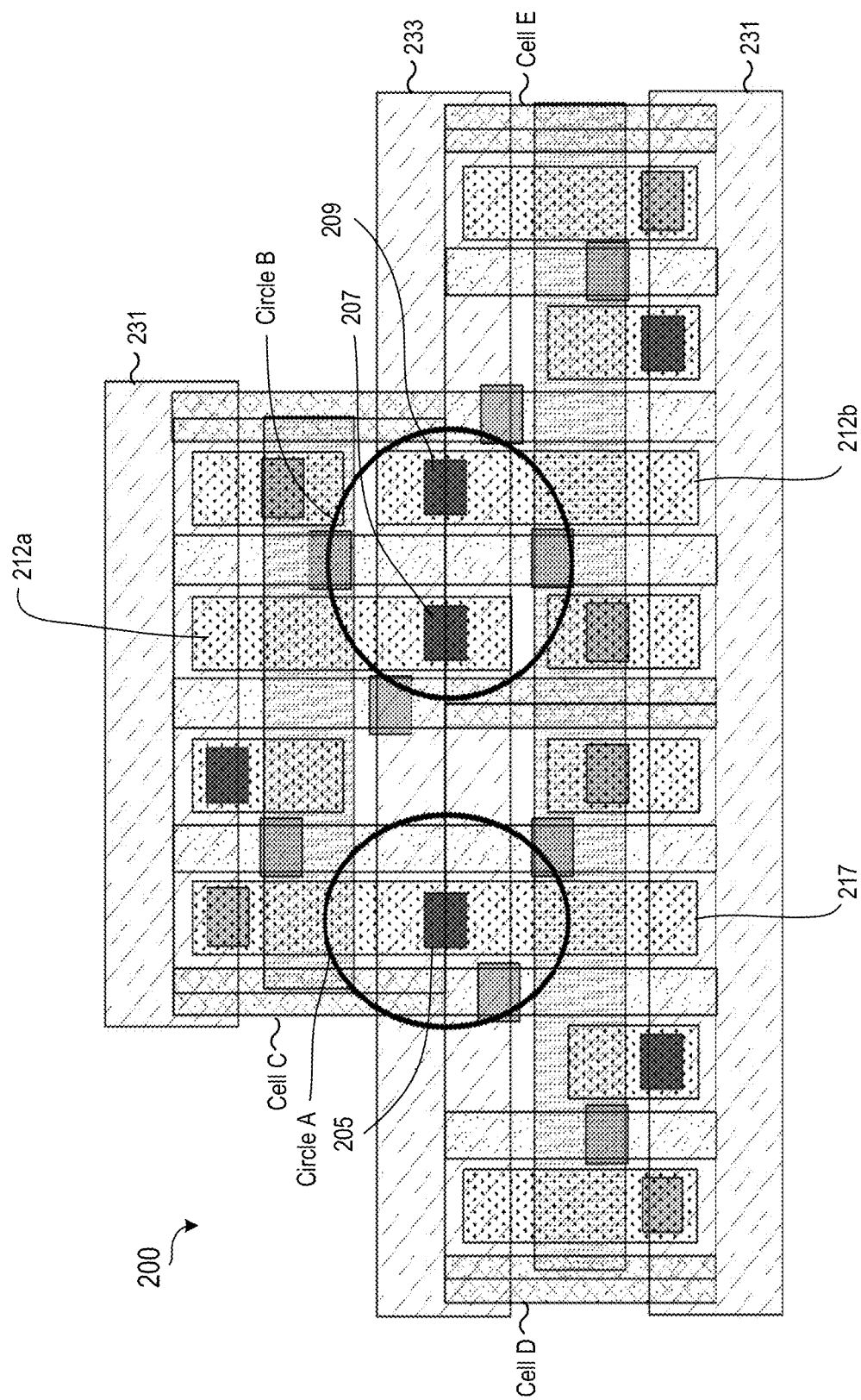
FIG. 2 shows a layout diagram of a top view of a semiconductor device, in accordance with another embodiment of the disclosure.

FIG. 2 shows a layout diagram of a top view of a semiconductor device 200, in accordance with another embodiment of the disclosure. In a non-limiting example, the semiconductor device 200 includes three adjacent cells, Cell C, Cell D, and Cell E, three BPRs 231 and 233, and a plurality of M0 tracks (e.g., 205, 207 and 209). The overall density of the power-taps is sufficient to robustly feed power from the BPRs 231 and 233 to an FSPDN. In addition, FIG. 2 can be a top view of three adjacent cells with power-taps available to strap BPR to M0 tracks in Circle A and Circle B. Circle A shows ideal case of aligned power-taps. Circle B shows a pair of single-sided power-taps.

Specifically, the M0 track 205 in Circle A is configured in a way that is similar to the common power tap track 105 in FIG. 1. That is, the M0 track 205 is positioned on a common cell boundary of Cell C and Cell D and connected to the BPR 233 via a common LI structure 217. Thus, the BPR 233 can function as a common BPR for Cell C and Cell D. While the M0 tracks 207 and 209 are both positioned on a common cell boundary of Cell C and Cell E, the M0 tracks 207 and 209 are configured differently from the M0 track 205. For example, the M0 track 207 is only connected to Cell C via a first LI structure 212a whereas the M0 track 209 is only connected to Cell E via a second LI structure 212b.

Thus, techniques herein provide a structure using LI power-taps, which are structures or constructs configured to draw power from the BPR, to feed power from the FSPDN to the BPR. By opportunistically connecting M0 to the BPR after cell placement, a highly redundant connection can be established without impacting placement density.

A further novel aspect is the reordering of critical components of the design flow. Typically in related examples, the entire PDN is created by the power-router before cell placement and detailed signal routing. With techniques herein, the connection between the BPR and the FSPDN, either to feed power into the BPR from the front side of the wafer, or to connect a multi-tier 3D stack to a common BSPDN, can be formed after cell placement. The high density of cell-level power-taps ensures that a sufficient number of opportunistic connections will be established. Further PDN robustness can be provided by designing similar power pass-throughs into all filler cells.

Figure 7:
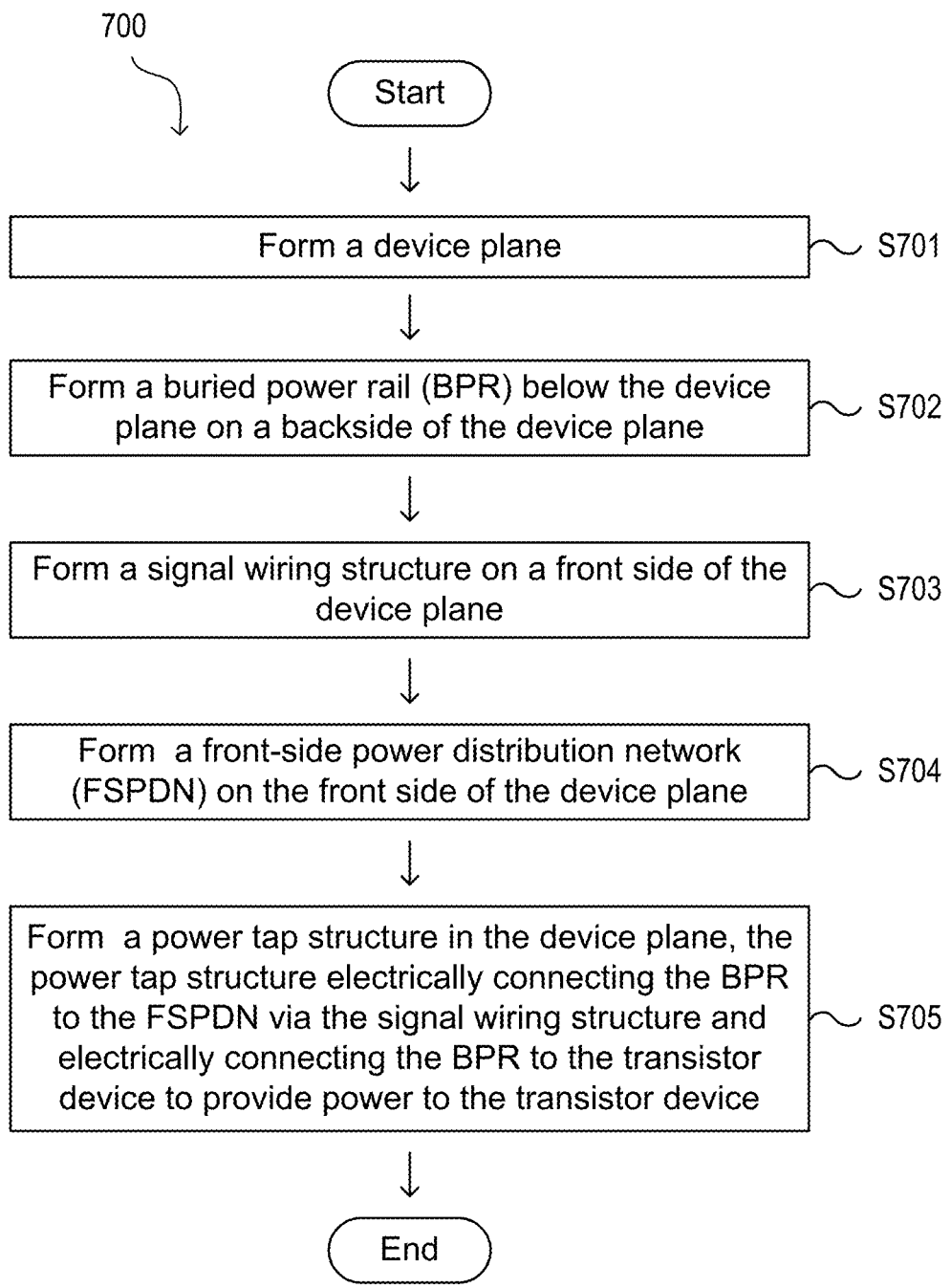
FIG. 7 shows a flow chart outlining a process example, in accordance with exemplary embodiments of the disclosure.

FIG. 7 shows a flow chart outlining a process example for fabricating a semiconductor device, such as the semiconductor device 100, the semiconductor device 200 and the like, in accordance with exemplary embodiments of the disclosure. The process 700 starts with step S701 where a device plane is formed. The device plane can include an array of cells. For example, the array of cells can include a logic cell that has a transistor device.

At step S702, a BPR is formed below the device plane on a backside of the device plane. At step S703, a signal wiring structure is formed on a front side of the device plane. At step S704, an FSPDN is formed on the front side of the device plane.

The process 700 then proceeds to step S705 where a power tap structure is formed in the device plane. The power tap structure electrically connects the BPR to the FSPDN and electrically connects the BPR to the transistor device to provide power to the transistor device This disclosure includes a novel construct, associated process integration solution, and design methodology to efficiently and compactly connect a BPR to an FSPDN. Techniques include using space allocated to make robust connections between LI and the BPR (i.e., the power taps drawing power from the power rail and feeding it into the devices) to connect the BPR to the wiring above the device plane. By opportunistically connecting the empty M0 track to LI over existing power taps this power pass-through construct provides a highly redundant connection with many parallel vertical current paths and minimal lateral current load on the 1×M0 wire.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A semiconductor device, comprising:
    a first device plane including an array of cells each including a transistor device, the first device plane formed on a working surface of a substrate, the first device plane having a front side and a backside opposite the front side;
    a signal wiring structure formed on the front side of the first device plane;
    a front-side power distribution network (FSPDN) positioned on the front side of the first device plane;
    a first buried power rail (BPR) disposed below the first device plane on the backside of the first device plane; and
    a power tap structure in the first device plane, the power tap structure electrically connecting the first BPR to the FSPDN and electrically connecting the first BPR to at least one of the transistor devices to provide power to the at least one of the transistor devices.

2. The semiconductor device of claim 1, wherein the array of cells comprises a logic cell, and the FSPDN comprises a power tap track on a cell boundary of the logic cell, the power tap track disposed in a first wiring layer (M0).

3. The semiconductor device of claim 2, wherein the power tap structure comprises:
    an LI structure;
    a top contact that is disposed on the front side of the LI structure and contacts the power tap track; and
    a power via that is disposed on the backside of the LI structure and contacts the first BPR.

4. The semiconductor device of claim 3, wherein the LI structure extends in a horizontal direction along the working surface of the substrate so as to contact the transistor device of the logic cell.

5. The semiconductor device of claim 4, wherein:
    the FSPDN is electrically connected to the first BPR via the power tap structure, and
    the first BPR is configured to provide power to the transistor device via the LI structure.

6. The semiconductor device of claim 1, wherein the array of cells comprises a pair of adjacent logic cells, and the first BPR is disposed on a common cell boundary of the pair of adjacent logic cells and is configured to function as a common BPR.

7. The semiconductor device of claim 6, wherein the FSPDN comprises a common power tap track on the common cell boundary, the common power tap track disposed in a first wiring layer (M0).

8. The semiconductor device of claim 7, wherein the power tap structure comprises:
    a common LI structure within the pair of adjacent logic cells;
    a common top contact that is disposed on the front side of the common LI structure and contacts the common power tap track; and
    a common power via that is disposed on the backside of the common LI structure and contacts the first BPR.

9. The semiconductor device of claim 8, wherein:
    the common LI structure extends across the common cell boundary in a horizontal direction along the working surface of the substrate,
    one end of the common LI structure contacts a transistor device of one logic cell of the pair of adjacent logic cells, and
    another end of the common LI structure contacts a transistor device of the other logic cell of the pair of adjacent logic cells.

10. The semiconductor device of claim 9, wherein:
    the FSPDN is electrically connected to the first BPR via the power tap structure, and
    the power tap structure is configured to function as a common power tap structure in order for the first BPR to provide power to the transistor devices on the two ends of the common LI structure.

11. The semiconductor device of claim 9, wherein:
    the transistor devices include complementary field-effect transistors (CFETs), each having an N-type device over a P-type device,
    the P-type devices are configured to connect to the first BPR for $V_{DD}$ via the common LI structure, and
    the N-type devices in each adjacent logic cell are configured to connect to separate BPRs for $V_{SS}$ via separate power tap structures.

12. The semiconductor device of claim 1, wherein the array of cells comprises a pair of adjacent logic cells, and only one logic cell of the pair of adjacent logic cells includes a power tap structure while the other logic cell of the pair of adjacent logic cells has a signal connection that is positioned away from an outer M0 track.

13. The semiconductor device of claim 1, further comprising a backside power distribution network (BSPDN) positioned below the first BPR on the backside of the first device plane, wherein the first BPR is electrically connected to the BSPDN via a bottom through-silicon via (TSV).

14. The semiconductor device of claim 1, further comprising a power tap cell in the array of cells, the power tap cell providing power to the transistor device by electrically connecting the transistor device to the first BPR.

15. The semiconductor device of claim 14, wherein the power tap cell further comprises a conductive structure that connects the first BPR to the FSPDN.

16. The semiconductor device of claim 1, further comprising:
    a second device plane positioned below the first BPR;
    a second BPR below the second device plane; and
    a BSPDN below the second BPR, wherein the second BPR is electrically connected to the BSPDN and is configured to provide power to a device in the second device plane.

17. A method of microfabrication, comprising:
    forming a device plane including an array of cells each including a transistor device, the device plane formed on a working surface of a substrate, the device plane having a front side and a backside opposite the front side;

forming a buried power rail (BPR) that is positioned below the device plane on the backside of the device plane;

forming a signal wiring structure on the front side of the device plane;

forming a front-side power distribution network (FSPDN) on the front side of the device plane; and forming a power tap structure in the device plane, the power tap structure electrically connecting the BPR to the FSPDN and electrically connecting the BPR to the transistor device to provide power to the transistor device.

18. The method of claim 17, wherein connection between the BPR and the FSPDN is formed after forming the array of cells.

19. The method of claim 17, further comprising forming a power tap cell in the array of cells, the power tap cell electrically connecting the BPR to the FSPDN.

20. The method of claim 17, further comprising forming a backside power distribution network (BSPDN) on the backside of the device plane, the BSPDN disposed below and connected to the BPR.

* * * * *

UNITED STATES PATENT AND TRADEMARK OFFICE
CERTIFICATE OF CORRECTION

PATENT NO. : 11,961,802 B2
APPLICATION NO. : 17/328236
DATED : April 16, 2024
INVENTOR(S) : Liebmann et al.

It is certified that error appears in the above-identified patent and that said Letters Patent is hereby corrected as shown below:

On the Title Page

Column 2, Item (56), under "OTHER PUBLICATIONS" Line 1, delete "ofthe" and insert -- of the --, therefor.

Signed and Sealed this
Twenty-sixth Day of November, 2024

Katherine Kelly Vidal
*Director of the United States Patent and Trademark Office*